United States Patent
Park (10) Patent No.: US 9,465,084 B2
(45) Date of Patent: Oct. 11, 2016

(54) APPARATUS AND METHOD FOR DIAGNOSING BATTERY CELL DEFECT

(71) Applicants: Hyundai Motor Company, Seoul (KR); KIA MOTORS CORPORATION, Seoul (KR)

(72) Inventor: Hyun-Soo Park, Anyang-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 177 days.

(21) Appl. No.: 14/321,622

(22) Filed: Jul. 1, 2014

(65) Prior Publication Data

US 2015/0234015 A1    Aug. 20, 2015

(30) Foreign Application Priority Data

Feb. 18, 2014  (KR) .................. 10-2014-0018740

(51) Int. Cl.
  *G01N 27/416* (2006.01)
  *G01R 31/36* (2006.01)
  *G01R 21/133* (2006.01)
  *G01R 19/165* (2006.01)

(52) U.S. Cl.
  CPC ....... *G01R 31/3658* (2013.01); *G01R 31/3679* (2013.01); *G01R 19/16542* (2013.01); *G01R 21/1331* (2013.01); *G01R 31/3624* (2013.01); *G01R 31/3648* (2013.01)

(58) Field of Classification Search
  CPC ............ G01R 31/3658; G01R 31/362; G01R 31/3648; G01R 21/1331
  USPC ........................................ 324/426
  See application file for complete search history.

(56) References Cited

U.S. PATENT DOCUMENTS

| | | | | |
|---|---|---|---|---|
| 8,489,347 B2* | 7/2013 | Shimizu | ............. | G01R 31/3658 702/62 |
| 8,635,038 B2* | 1/2014 | Benjamin | .......... | G01R 31/3658 320/104 |
| 9,075,090 B2* | 7/2015 | Zimmerman | .... | G01R 19/16542 |
| 9,103,890 B2* | 8/2015 | Sugimura | .......... | G01R 31/3606 |
| 9,128,161 B2* | 9/2015 | Mizoguchi | ........... | G01R 31/362 |
| 9,203,248 B2* | 12/2015 | Ohkawa | ................ | B60L 3/0046 |
| 2012/0139553 A1* | 6/2012 | Nortman | ............... | H02J 7/0016 324/537 |
| 2012/0203482 A1* | 8/2012 | Parle | .................. | G01R 31/3658 702/63 |
| 2014/0147713 A1* | 5/2014 | Mizobe | ................ | G01R 31/362 429/90 |

(Continued)

FOREIGN PATENT DOCUMENTS

| | | |
|---|---|---|
| JP | 2009-042071 A | 2/2009 |
| KR | 10-2006-0052273 A | 5/2006 |

(Continued)

*Primary Examiner* — M'Baye Diao
(74) *Attorney, Agent, or Firm* — McDermott Will & Emery LLP (57) ABSTRACT

An apparatus for diagnosing a battery cell defect includes a battery having a plurality of battery cells, a sensing portion configured to sense the battery to generate sensing information, a calculation portion configured to calculate real used power and a cell voltage of each of the plurality battery cells using the generated sensing information, a monitoring portion configured to store information on whether the battery is overused in the form of a power monitoring set using the calculated real used power, and a determination portion configured to determine, when the calculated cell voltage reaches a preset lower limit voltage value, whether each of the plurality battery cells fails using the power monitoring set and a cell voltage deviation.

20 Claims, 6 Drawing Sheets

(56) References Cited

U.S. PATENT DOCUMENTS

| | | | |
|---|---|---|---|
| 2014/0176145 A1* | 6/2014 | Park | H01M 8/04679 324/426 |
| 2014/0225620 A1* | 8/2014 | Campbell | B60L 11/1838 324/426 |
| 2015/0346283 A1* | 12/2015 | Kwon | G01R 31/3662 702/63 |

FOREIGN PATENT DOCUMENTS

| | | |
|---|---|---|
| KR | 10-2011-0062130 A | 6/2011 |
| KR | 10-2011-0134019 A | 12/2011 |
| KR | 10-2013-0075379 A | 7/2013 |
| KR | 10-2013-0077134 A | 7/2013 |
| KR | 10-2013-0089365 A | 8/2013 |
| WO | 2012/026052 A1 | 3/2012 |

* cited by examiner

| CONDITION | | ANALYZED RESULT | |
|---|---|---|---|
| TEST CONDITION | REFERENCE VOLTAGE | A | B |
| SOC 0% @ 40°C | 1V | 2.160~2.168V | 15.2~15.4s |
| SOC 10% @ 45°C | 2.5V | 817~822mV | 7.9~8.0s |
| SOC 0% @ -15°C | 1V | 1.953~2.016V | 4.04~4.1s |
| SOC 10% @ -10°C | 2.5V | 633~647mV | 0.3~0.4s |

APPARATUS AND METHOD FOR DIAGNOSING BATTERY CELL DEFECT

CROSS-REFERENCE TO RELATED APPLICATION

This application claims the benefit of priority to Korean Patent Application No. 10-2014-0018740, filed on Feb. 18, 2014, the entire content of which is incorporated herein by reference.

TECHNICAL FILED

The present inventive concept relates to a battery diagnostic technique, and particularly, to an apparatus and a method for diagnosing a battery cell defect, which detect failure caused by a battery cell defect using real used power, a voltage behavior, a voltage deviation, and the like of a high-voltage battery cell.

BACKGROUND

Various types of eco-friendly vehicles are being developed and an electric vehicle is given attention as the eco-friendly vehicle.

Since the electric vehicle is driven using charge/discharge energy of a battery pack, the electric vehicle is well received by consumers in terms of the capability of excellent fuel efficiency and reduced pollutants compared to an engine vehicle. Thus, a battery, which is a core part of the electric vehicle, is the subject of interest and study.

Accordingly, safety of the battery becomes more important as products using the battery increase. Moreover, since the electric vehicle has a structure in which one pack includes a plurality of battery cells as secondary cells and one high capacity battery includes a plurality of packs, the battery of the electric vehicle needs to be more safely maintained than that of a typical portable electric product.

In particular, resistance is caused by aging of the battery cells constituting the battery or by the release of a bus bar for connection between the battery cells. Once such resistance increases, heat may be generated in the battery to thereby damage an internal circuit of the battery or the battery itself. Furthermore, this may cause a battery explosion resulting in a fire.

Accordingly, a technique for diagnosing failure of the battery is needed. In the technique, failure of the battery is generally diagnosed using only a voltage deviation between the battery cells. Particularly, a detection condition is set as wide as possible in consideration of unfavorable circumstances for prevention of misdetection. As a result, an abnormality of a sensing circuit may be detected rather than detection of a battery cell defect and thus a defect diagnosis may be impossible.

Moreover, since the voltage deviation is typically generated within 1V, when a field claim occurs due to a battery cell defect, a DTC (Diagnostic Trouble Code) related to the same may not be operated.

In addition, even when the battery cells are normal, the voltage deviation between the battery cells may be increased when the high-voltage battery is overused. Thus, when the cell voltage by the voltage deviation reaches a given lower limit voltage, usable power of the battery during discharge thereof is limited, resulting in effect on the performance of the vehicle.

SUMMARY

An aspect of the present inventive concept is directed to an apparatus and a method for diagnosing a battery cell defect, which detect a cell defect instead of detecting abnormality of a sensing circuit.

Another aspect of the present inventive concept is directed to an apparatus and a method for diagnosing a battery cell defect, capable of performing defect detection when operability of a vehicle is poor to the extent of being felt by a driver so as to store a DTC (Diagnostic Trouble Code).

Another aspect of the present inventive concept is directed to an apparatus and a method for diagnosing a battery cell defect, in which an abnormal voltage deviation may be distinguished from a normal voltage deviation to be detected.

To achieve the above objects, the present inventive concept provides an apparatus and a method for diagnosing a battery cell defect, which detect a cell defect instead of detecting abnormality of a sensing circuit.

One aspect of the present inventive concept relates to an apparatus for diagnosing a battery cell defect including a battery having a plurality of battery cells, a sensing portion configured to sense the battery to generate sensing information, a calculation portion configured to calculate real used power and each cell voltage of the plurality of battery cells using the generated sensing information, a monitoring portion configured to store information on whether the battery is overused in the form of a power monitoring set using the calculated real used power, and a determination portion configured to determine, when the calculated cell voltage reaches a preset lower limit voltage value, whether each of the plurality of battery cells fails using the power monitoring set and a cell voltage deviation.

The power monitoring set may be data indicating a result of comparing whether the calculated real used power for a first time period is larger than a usable power limit value.

The data may be digital data, and the data may be "1" when the calculated real used power is larger than a current usable power limit value and be "0" when the calculated real used power is smaller than the current usable power limit value.

The usable power limit value may be determined according to a matching of a preset lookup table with the sensing information of the battery.

The sensing information may be at least one of a temperature and a State of Charge (SOC) of the battery.

The first time period may be a time period before the usable power limit value reaches a specific value.

The failure determination of each of the plurality of battery cells may be performed according to whether or not to satisfy a first condition under which the usable power limit value reaches the specific value, a second condition under which the cell voltage deviation is more than or equal to a preset reference value, and a third condition under which the first and second conditions are maintained for a second time period.

The calculated cell voltage may be a cell minimum voltage.

The apparatus may further include a storage portion configured to store defect detection according to a failure status in the form of a Diagnostic Trouble Code (DTC).

The apparatus may further include an output configured to output the defect detection in a combined form of graphics, characters, sound, and warning lamp lighting.

Another aspect of the present inventive concept encompasses a method for diagnosing a battery cell defect including sensing a battery to generate sensing information. Real used power and a cell voltage of each of the plurality of battery cells are calculated using the generated sensing information. Monitoring operation is performed by storing information on whether the battery is overused in the form of a power monitoring set using the calculated real used power. It is determined whether the calculated cell voltage reaches a preset lower limit voltage value. Failure of the plurality of battery cells is determined using the power monitoring set and a cell voltage deviation is determined when it is determined that the calculated cell voltage reaches the lower limit voltage value as the determined result.

The determining of failure may include identifying whether the usable power limit value reaches the specific value and at the same time whether the cell voltage deviation is more than or equal to a preset reference value. When it is identified as a first condition that the usable power limit value reaches the specific value and it is identified as a second condition that the cell voltage deviation is equal to or more than the preset reference value as the identified result, it is determined whether the first and second conditions are maintained for a second time period. When the first and second conditions are maintained for the second time period, it is determined that a defect is detected.

The determining failure may further include storing defect detection according to the failure status in the form of a Diagnostic Trouble Code (DTC).

The method may further include outputting the detection of the defect in a combined form of graphics, characters, sound, and warning lamp lighting.

BRIEF DESCRIPTION OF THE DRAWINGS

The above and other objects, features and advantages of the present inventive concept will be more apparent from the following detailed description taken in conjunction with the accompanying drawings, in which like reference characters may refer to the same or similar parts throughout the different views. The drawings are not necessarily to scale, emphasis instead being placed upon illustrating the principles of the embodiments of the inventive concept.

DETAILED DESCRIPTION

Exemplary embodiments of the present inventive concept will be described below in more detail with reference to the accompanying drawings. The present inventive concept may, however, be embodied in different forms and should not be construed as limited to the embodiments set forth herein. Rather, these embodiments are provided so that this disclosure will be thorough and complete, and will fully convey the scope of the present inventive concept to those skilled in the art. Therefore, it should be understood that the scope and spirit of the present inventive concept can be extended to all variations, equivalents, and replacements in addition to the appended drawings of the present inventive concept.

Throughout the disclosure, like reference numerals refer to like parts throughout the various figures and embodiments of the present inventive concept.

Furthermore, the terms including expressions, such as first and/or second, used in the specification of the present inventive concept may be used to describe various elements of the present inventive concept. However, the elements of the present inventive concept should not be limited by the terms used in the specification of the present inventive concept. In other words, such terms will be used only to differentiate one element from other elements of the present inventive concept.

For example, without deviating from the scope and spirit of the present inventive concept, a first element may be referred to as a second element, and, similarly, a second element may also be referred to as a first element. As used herein, the term "and/or" includes any and all combinations of one or more of the associated listed items.

Unless otherwise defined, all terms, including technical and scientific terms, used herein have the same meaning as commonly understood by one of ordinary skill in the art.

It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, an apparatus and a method for diagnosing a battery cell defect according to an embodiment of the present inventive concept will be described below in more detail with reference to the accompanying drawings.

Figure 1:
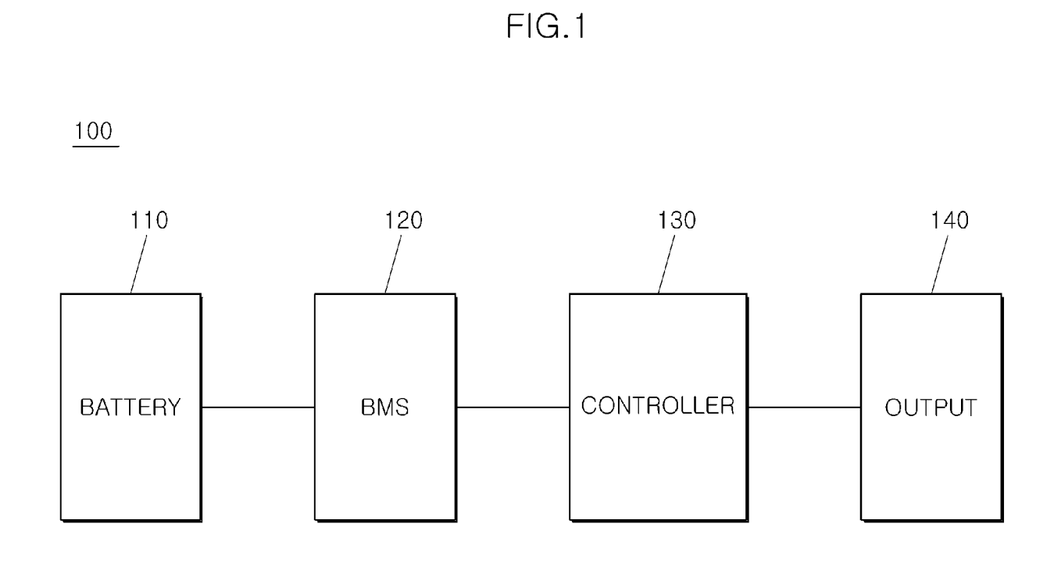
FIG. 1 is a block diagram illustrating a configuration of an apparatus for diagnosing a battery cell defect according to an embodiment of the present inventive concept.

FIG. 1 is a block diagram illustrating a configuration of an apparatus 100 for diagnosing a battery cell defect according to an embodiment of the present inventive concept. Referring to FIG. 1, the apparatus 100 for diagnosing a battery cell defect may include a battery 110, a Battery Management System (BMS) 120, a controller 130 and an output 140. The BMS 120 may be configured to perform a battery cell defect diagnosis of the battery 110 by analyzing, when a cell voltage of the battery 110 reaches a given lower limit voltage, a behavior of real used power of the battery 110 for a certain time immediately before the cell voltage of the battery 110 reaches the given lower limit voltage and monitoring a cell voltage deviation only when the battery is used within a power limit value permitted in a vehicle. The controller 130 may be configured to control the BMS 120. The output 140, if the battery cell defect is detected, may be configured to output a result of the defect detection in a combined form of graphics, characters, sound, and/or warning lamp lighting.

The battery 110 may include battery cells (not shown) configured in series and/or in parallel. The battery cells may be a battery for an electric vehicle, for example a nickel-metal battery or a lithium-ion battery.

Here, an example of the electric vehicle may include an EV (Electric Vehicle), an HEV (Hybrid Electric Vehicle), a PHEV (Plug-in Hybrid Electric Vehicle), a fuel cell vehicle, etc.

The output 140 may include a display system, a sound system, and/or a warning lamp so as to output the result of the defect detection in the combined form of graphics, characters, sound, and/or warning lamp lighting. These components may be included inside or outside a vehicle cluster.

The controller 130 may be configured to control components such as the battery 110, the BMS 120, and/or the output 140, and/or transmit and receive data signals to control them.

Figure 2:
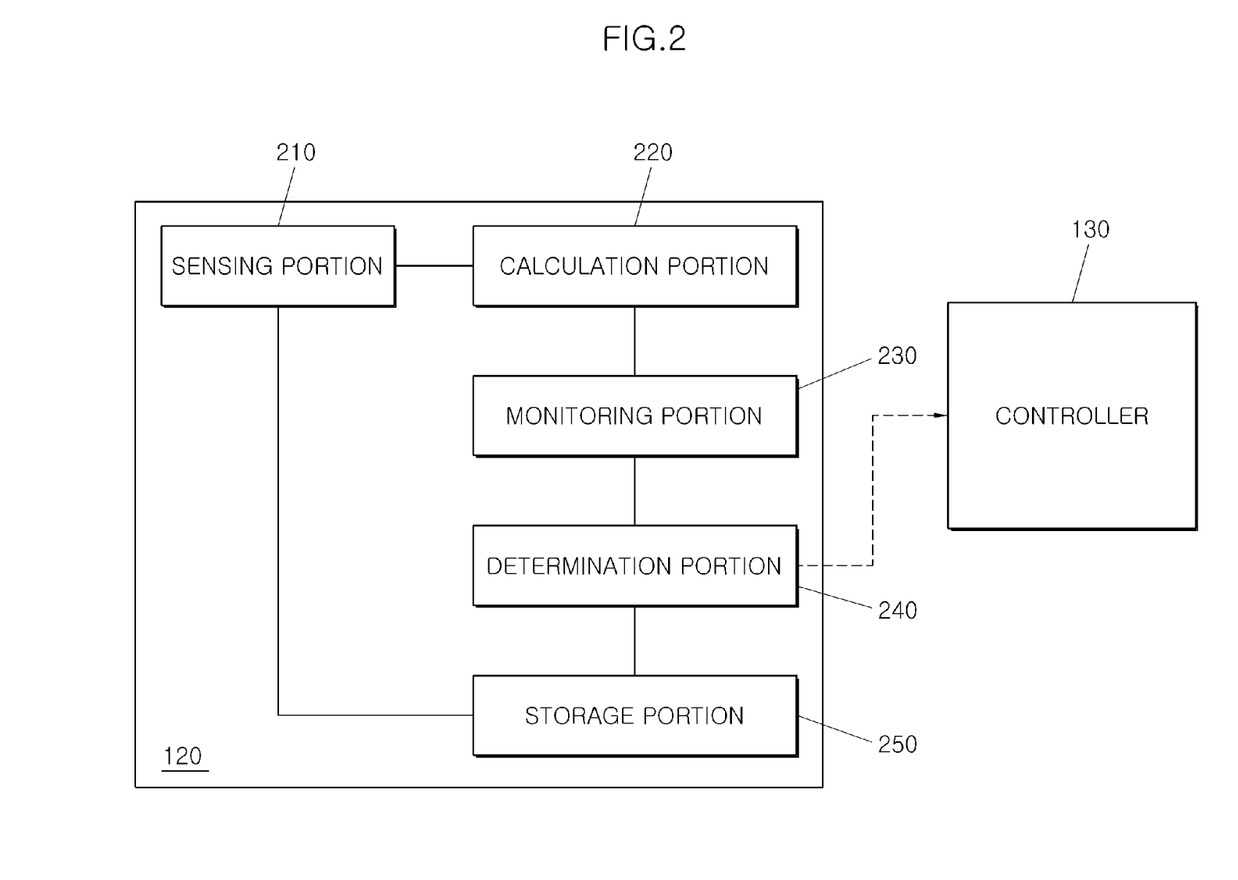
FIG. 2 is a block diagram illustrating a detailed configuration of a BMS (Battery Management System) shown in FIG. 1.

FIG. 2 is a block diagram illustrating a detailed configuration of the BMS 120 shown in FIG. 1. Referring to FIG. 2, the BMS 120 may include a sensing portion 210, a calculation portion 220, a monitoring portion 230, a determination portion 240 and a storage portion 250. The sensing portion 210 may be configured to sense the battery 110 (see FIG. 1) to generate sensing information. The calculation portion 220 may be configured to calculate real used power and each cell voltage of the plurality of battery cells using the generated sensing information. The monitoring portion 230 may be configured to store information on whether the battery is overused, in the form of a power monitoring set, using the calculated real used power. The determination portion 240 may be configured to determine, when the calculated cell voltage reaches a preset lower limit voltage value, whether each of the plurality of battery cells fails, using the power monitoring set and the cell voltage deviation. The storage portion 250 may be configured to store defect detection according to a failure status in the form of a Diagnostic Trouble Code (DTC).

The sensing portion 210 may include a current sensor which senses a current of the battery 110 (see FIG. 1), a voltage sensor which senses a voltage of the battery 110, a power sensor which senses power of the battery 110, a temperature sensor which senses a temperature of the battery 110, etc. Particularly, the current sensor and the voltage sensor may be configured to individually sense the battery cells included in the battery 110. Accordingly, each of the current sensor and the voltage sensor may be installed for each battery cell to sense the same or each sensor may also be installed for all the battery cells to sense the same.

Thus, the sensing portion 210 may generate sensing information and the sensing information may include a voltage, a current, power, a temperature, a State of Charge (SOC), an State of Health (SOH), etc.

The storage portion 250 may be included in the BMS 120 as a separate storage portion. The storage portion 250 may be a combination of a nonvolatile memory such as a hard disc drive, a flash memory, an Electrically erasable programmable read-only memory (EEPROM), an Static RAM (SRAM), an Ferro-electric RAM (FRAM), a Phase-change RAM (PRAM), or a Magnetic RAM (MRAM), and/or a volatile memory such as a Dynamic Random Access Memory (DRAM), a Synchronous Dynamic Random Access Memory (SDRAM), or a Double Data Rate-SDRAM (DDR-SDRAM).

Thus, the storage portion 250 may be configured to store a program code and/or data, a power monitoring set, a preset lookup table, and the like for realizing an algorithm which performs the battery cell defect diagnosis of the battery 110 by analyzing, when the cell voltage of the battery 110 reaches a given lower limit voltage, the behavior of the real used power of the battery 110 for a certain time immediately before the cell voltage of the battery 110 reaches the given lower limit voltage and monitoring the cell voltage deviation only when the battery is used within the power limit value permitted in the vehicle.

Here, the power monitoring set may be digital data as a result of comparing whether the calculated real used power for a certain time is larger than a usable power limit value. In particular, the power monitoring set may be a data set which is stored for determining whether the high-voltage battery is overused in the vehicle for a certain time.

For example, the power monitoring set may be "1" when the calculated real used power is larger than a current usable power limit value and may be "0" when the calculated real used power is smaller than a current usable power limit value. In addition, the usable power limit value may be determined according to a matching of the preset lookup table with the sensing information of the battery.

Thus, a data form stored when the battery 110 (see FIG. 1) is wholly used within the usable power limit value $Power_{limit}$ for a certain time of one second, may be "0000000000." In this case, each digit of the data form may indicate a comparison result corresponding to a time for a storage reference, which is 100 ms.

For example, a data form stored when the power of the battery is used over the usable power limit value at a moment of 300 ms for a certain time of one second, is "0000000100." That is, the data "1" is a comparison result at 300 ms when the digits of the data are stored in time order from the most right side.

Figure 3:
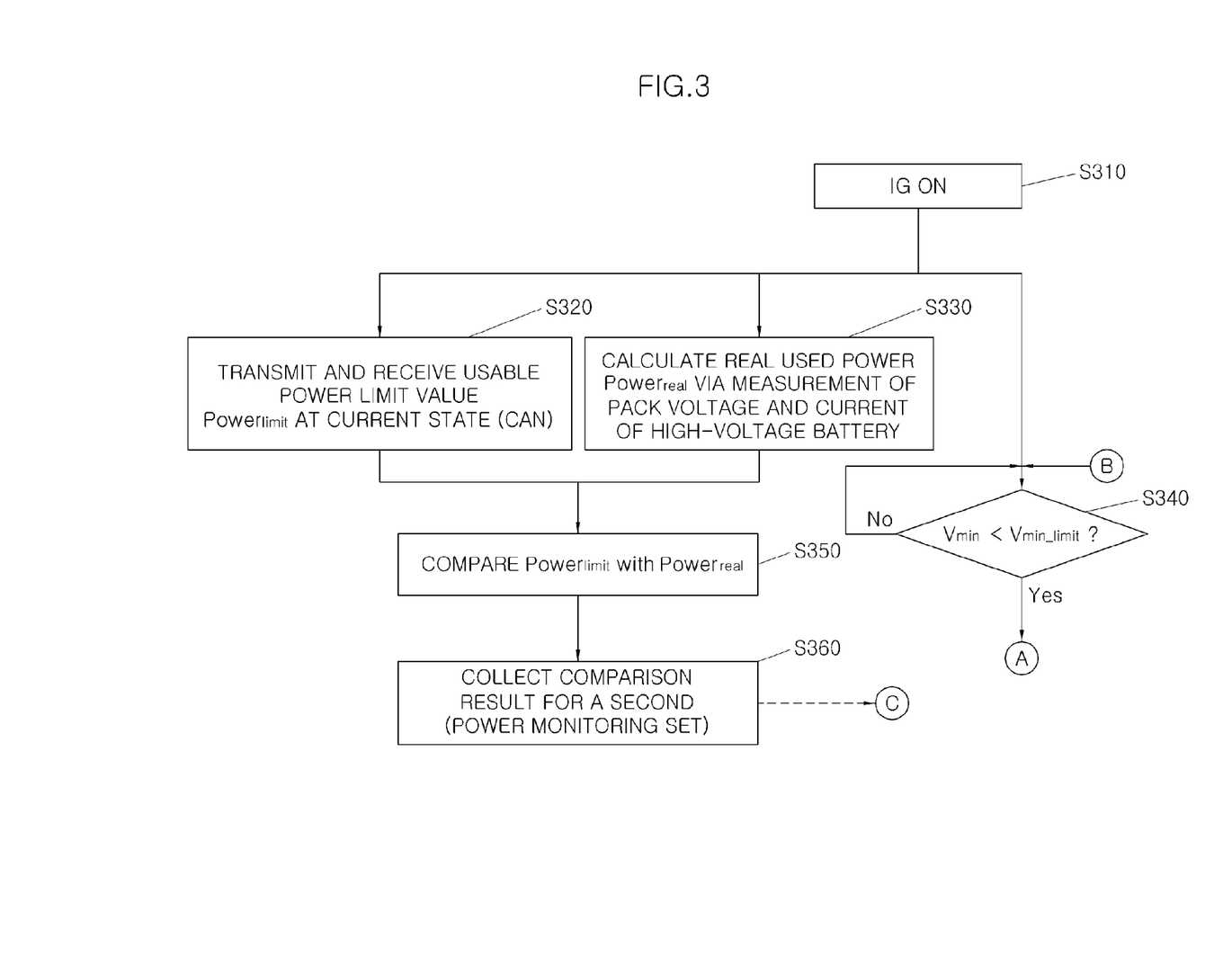
FIGS. 3 and 4 are flowcharts illustrating a process of diagnosing a defect by monitoring a cell voltage deviation only when a battery is used within a power limit value according to an embodiment of the present inventive concept.
Figure 4:
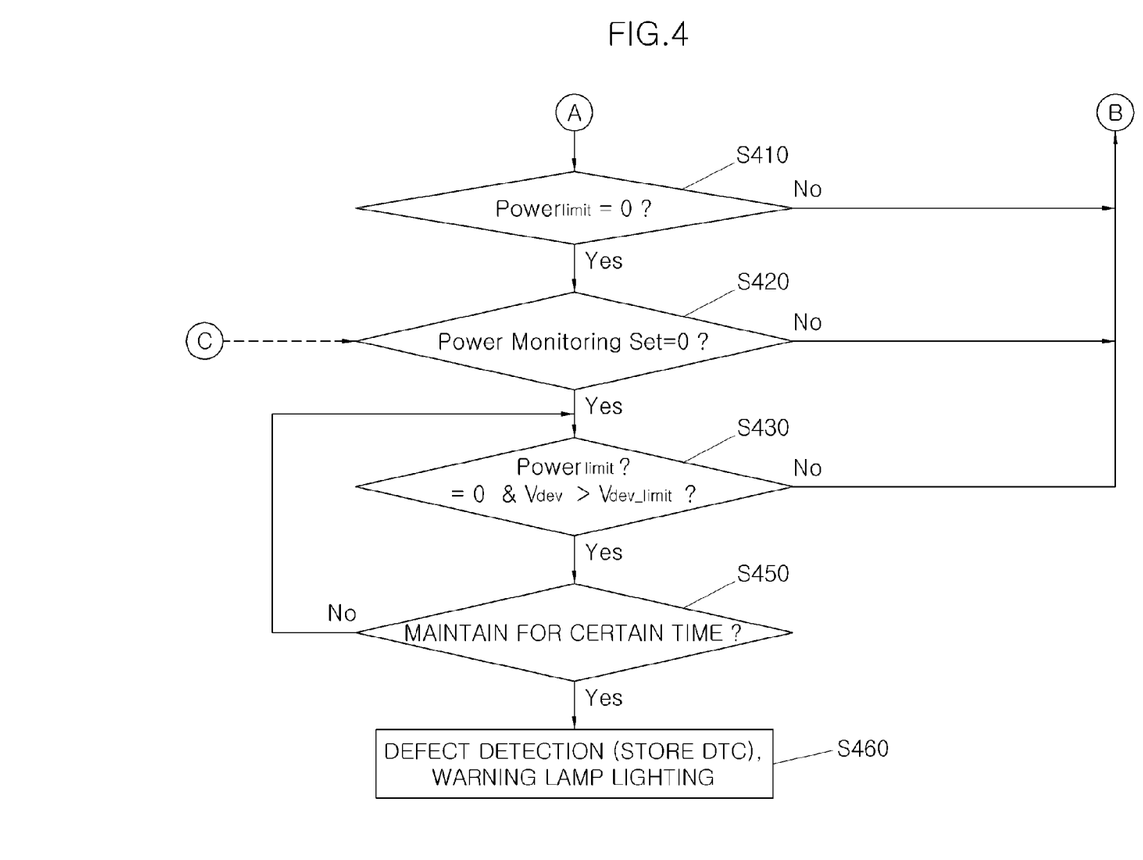

FIGS. 3 and 4 are flowcharts illustrating a process of diagnosing a defect by monitoring the cell voltage deviation only when the battery is used within the power limit value according to an embodiment of the present inventive concept. Prior to explanation of FIGS. 3 and 4, parameters and/or constants are defined as follows:

$Power_{limit}$: usable power limit value;
$Power_{real}$: real used power;
$V_{dev}$: cell voltage deviation;
$V_{dev\_limit}$ reference value (threshold) for detecting an abnormality of cell voltage deviation;
$V_{min}$: cell minimum voltage; and
$V_{min\_limit}$: lower limit voltage value.

Referring to FIGS. 3 and 4, when ignition of the vehicle is turned on, the diagnosing process may sense the battery 110 (see FIG. 1) to generate sensing information and calculate a value of real used power $Power_{real}$, a usable power limit value $Power_{limit}$ at a current state, and cell voltages $V_{min}$ of the plurality of battery cells using the generated sensing information (steps S310, S320, and S330).

The process may store information on whether the battery 110 is overused in the form of a power monitoring set using the calculated real used power $Power_{real}$ and usable power limit value $Power_{limit}$ (steps S350 and S360). In other words, the power monitoring set may be a result of comparing whether the calculated real used power for a certain time is larger than the usable power limit value. For example, the comparison result for a first certain time (for instance, about one second) before the usable power limit value $Power_{limit}$ reaches 0 kW may be stored.

In this case, the form of the stored power monitoring set may be "1" when the calculated real used power is larger than a current usable power limit value and may be "0" when the calculated real used power is smaller than a current usable power limit value.

Meanwhile, the process may calculate a value of real used power $Power_{real}$ and a usable power limit value $Power_{limit}$ and simultaneously determine whether a cell minimum voltage $V_{min}$ of the calculated cell voltages reaches a preset lower limit voltage value $V_{min\_limit}$ (step S340).

If the cell voltage $V_{min}$ reaches the lower limit voltage value as the determined result, the process may identify whether the usable power limit value $Power_{limit}$ reaches 0 kW (step S410). In other words, since the sensing information is changed according to operation and ambient temperature of the vehicle, the usable power limit value matched with the lookup table may be also changed. Accordingly, it may be identified whether the usable power limit value $Power_{limit}$ reaches 0 kW in real time.

If the usable power limit value $Power_{limit}$ reaches 0 kW as the identified result, it is determined whether the power monitoring set is "0" (step S420).

If the power monitoring set is "0" as the determined result at step S420, it may be determined that the battery 110 is normal. Therefore, the process may then determine whether the plurality of battery cells fail using the cell voltage deviation.

To this end, the process may identify whether the usable power limit value $Power_{limit}$ reaches a specific value (for instance, 0 kW) and at the same time whether the cell voltage deviation $V_{dev}$ is more than or equal to a preset reference value $V_{dev\_limit}$ (step S430).

If the usable power limit value $Power_{limit}$ reaches the specific value (for instance, 0 kW) and at the same time if the cell voltage deviation $V_{dev}$ is more than or equal to the preset reference value $V_{dev\_limit}$ as the identified result, it may be determined whether such two conditions are maintained for a second certain time (for instance, about 5 seconds) (step S450).

When the certain time is maintained at step S450, it may be determined that a defect is detected (step S460). In this case, the process may store the defect detection according to the failure status in the form of a Diagnostic Trouble Code (DTC) and output the detection of the defect in a combined form of graphics, characters, and sound. Of course, the detection of the defect may also be outputted in the form of warning lamp lighting.

Figure 5:
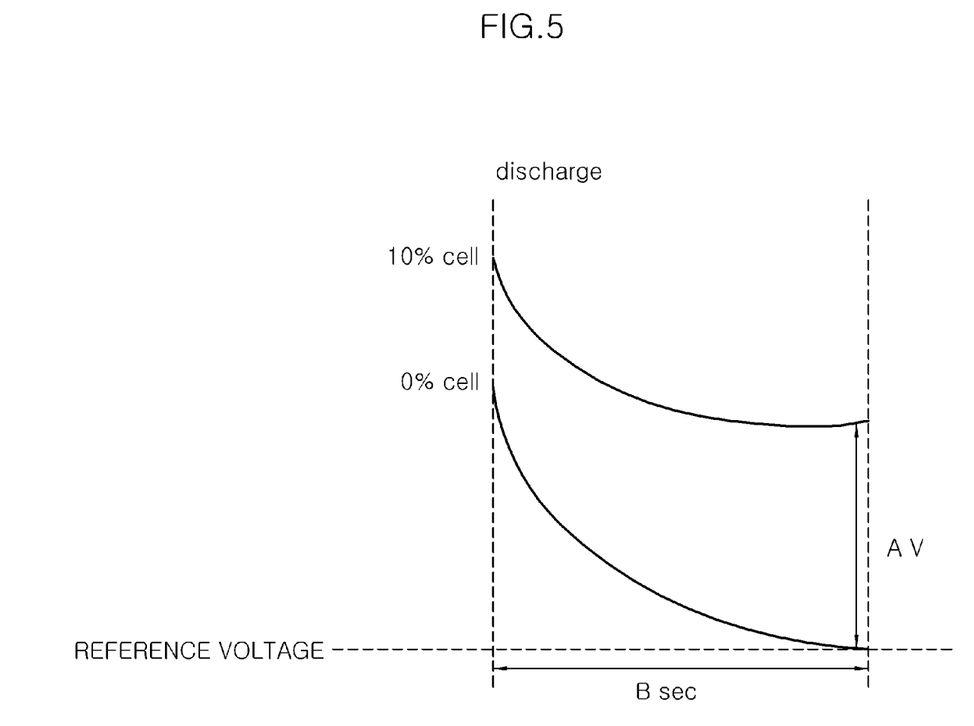
FIG. 5 is a conceptual view illustrating a generation principle of a typical cell voltage deviation.
Figure 6:
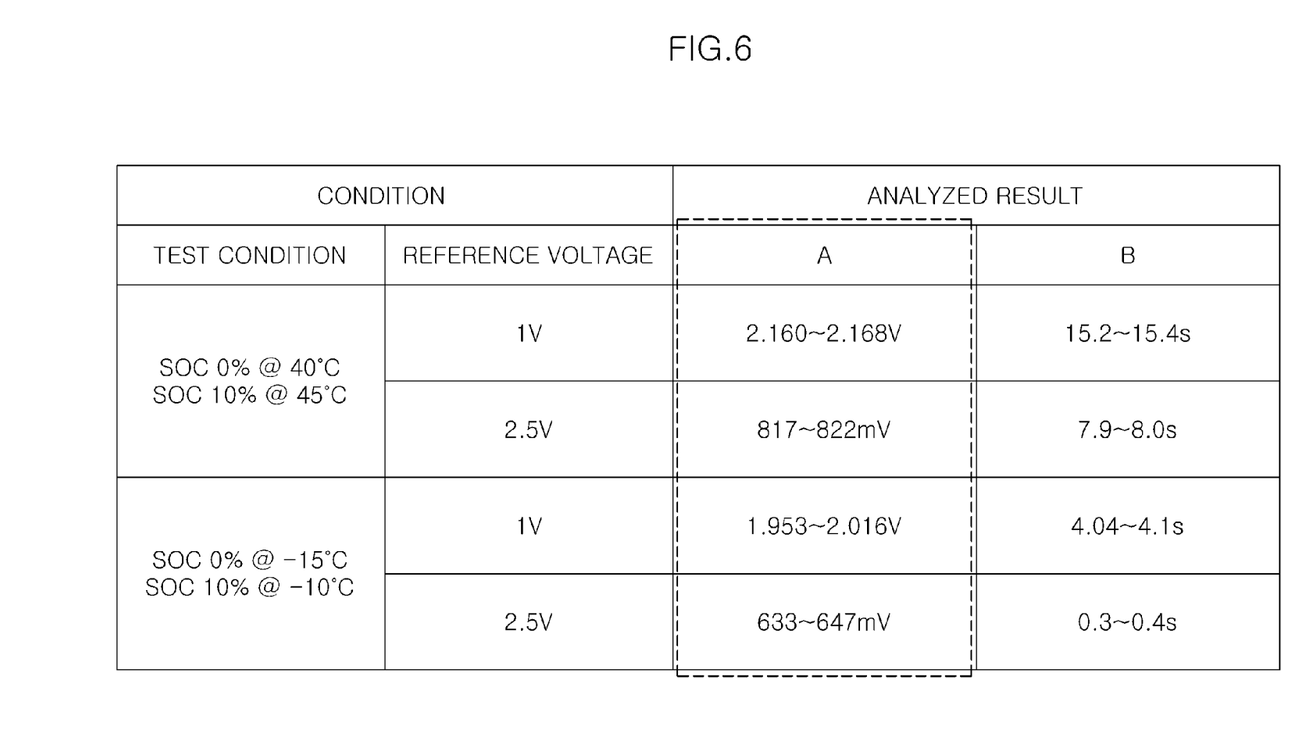
FIG. 6 is a comparative table illustrating an analyzed result of FIG. 5.

FIG. 5 is a conceptual view illustrating a generation principle of a typical cell voltage deviation. FIG. 6 is a comparative table illustrating an analyzed result of FIG. 5. In other words, when the battery 110 is overused even in a case of a normal cell, the cell voltage deviation may be generated due to environmental conditions of the vehicle. Accordingly, when an embodiment of the present inventive concept according to FIGS. 1 to 4 is applied, it may be possible to determine normality/abnormality of the battery cell even in a case of the excessive cell voltage deviation.

In accordance with exemplary embodiments of the present inventive concept, a failure diagnosis is performed in such a manner as to analyze, when a cell voltage of a battery reaches a given lower limit voltage, a behavior of used power of the battery for a certain time immediately before that time and monitor a cell voltage deviation only when the battery is used within a power limit value permitted in a BMS (Battery Management System). Therefore, a detection condition for the voltage deviation may be better actualized to improve the detection performance of a cell defect.

In addition, it may be possible to limit a failure diagnosis detection time to a time of actually affecting vehicle performance by adding a condition of reaching a lower limit value for limiting the use of the battery.

In addition, it may be possible to prevent misdetection by monitoring the used power of the battery.

While the present inventive concept has been described with respect to the specific embodiments, it will be apparent to those skilled in the art that various changes and modifications may be made without departing from the spirit and scope of the inventive concept as defined in the following claims.

What is claimed is:

1. An apparatus for diagnosing a battery cell defect, comprising:
    a battery having a plurality of battery cells;
    a sensing portion configured to sense the battery to generate sensing information;
    a calculation portion configured to calculate real used power and a cell voltage of each of the plurality of battery cells using the generated sensing information;
    a monitoring portion configured to store information on whether the battery is overused in the form of a power monitoring set using the calculated real used power; and
    a determination portion configured to determine, when the calculated cell voltage reaches a preset lower limit voltage value, whether each of the plurality of battery cells fails using the power monitoring set and a cell voltage deviation.

2. The apparatus of claim 1, wherein the power monitoring set is data indicating a result of comparing whether the calculated real used power for a first time period is larger than a usable power limit value.

3. The apparatus of claim 2, wherein:
    the data is digital data, and
    the data is "1" when the calculated real used power is larger than a current usable power limit value and is "0" when the calculated real used power is smaller than the current usable power limit value.

4. The apparatus of claim 2, wherein the usable power limit value is determined according to a matching of a preset lookup table with the sensing information of the battery.

5. The apparatus of claim 4, wherein the sensing information is at least one of a temperature and a State of Charge (SOC) of the battery.

6. The apparatus of claim 2, wherein the first time period is a time period before the usable power limit value reaches a specific value.

7. The apparatus of claim 6, wherein the failure determination of each of the plurality of battery cells is performed according to whether or not to satisfy a first condition under which the usable power limit value reaches the specific value, a second condition under which the cell voltage deviation is more than or equal to a preset reference value, and a third condition under which the first and second conditions are maintained for a second time period.

8. The apparatus of claim 1, wherein the calculated cell voltage is a cell minimum voltage.

9. The apparatus of claim 1, further comprising a storage portion configured to store defect detection according to a failure status in the form of a Diagnostic Trouble Code (DTC).

10. The apparatus of claim 9, further comprising an output configured to output the defect detection in a combined form of graphics, characters, sound, and warning lamp lighting.

11. A method for diagnosing a battery cell defect, comprising:
    sensing a battery having a plurality of battery cells to generate sensing information by a sensing portion;
    calculating real used power and a cell voltage of each of the plurality of battery cells using the generated sensing information by a calculation portion;
    performing monitoring operation by storing information on whether the battery is overused in the form of a power monitoring set using the calculated real used power by a monitoring portion;

determining whether the calculated cell voltage reaches a preset lower limit voltage value by a determination portion; and determining failure of the plurality of battery cells using the power monitoring set and a cell voltage deviation when it is determined that the calculated cell voltage reaches the lower limit voltage value by the determination portion.

12. The method of claim 11, wherein the power monitoring set is data indicating a result of comparing whether the calculated real used power for a first time period is larger than a usable power limit value.

13. The method of claim 12, wherein:

the data is digital data, and the data is "1" when the calculated real used power is larger than a current usable power limit value and is "0" when the calculated real used power is smaller than the current usable power limit value.

14. The method of claim 12, wherein the usable power limit value is determined according to a matching of a preset lookup table with the sensing information of the battery.

15. The method of claim 14, wherein the sensing information is at least one of a temperature and a State of Charge (SOC) of the battery.

16. The method of claim 12, wherein the first time period is a time period before the usable power limit value reaches a specific value.

17. The method of claim 16, wherein the determining failure comprises:

identifying whether the usable power limit value reaches the specific value and at the same time whether the cell voltage deviation is more than or equal to a preset reference value;

determining, when it is identified as a first condition that the usable power limit value reaches the specific value and it is identified as a second condition that the cell voltage deviation is more than or equal to the preset reference value, whether the first and second conditions are maintained for a second time period; and determining, when it is determined that the first and second conditions are maintained for the second time period, it is determined that a defect is detected.

18. The method of claim 11, wherein the calculated cell voltage is a cell minimum voltage.

19. The method of claim 11, wherein the determining failure further comprises storing defect detection according to the failure status in the form of a Diagnostic Trouble Code (DTC).

20. The method of claim 19, further comprising outputting the detection of the defect in a combined form of graphics, characters, sound, and warning lamp lighting.

\* \* \* \* \*